United States Patent
Yeh

(10) Patent No.: US 10,247,864 B2
(45) Date of Patent: Apr. 2, 2019

(54) MULTI-FILM STRUCTURE

(71) Applicant: National Tsing Hua University, Hsinchu (TW)

(72) Inventor: Jien-Wei Yeh, Hsinchu (TW)

(73) Assignee: National Tsing Hua University (TW)

( * ) Notice: Subject to any disclaimer, the term of this patent is extended or adjusted under 35 U.S.C. 154(b) by 112 days.

(21) Appl. No.: 15/482,717

(22) Filed: Apr. 8, 2017

(65) Prior Publication Data

US 2018/0128952 A1    May 10, 2018

(30) Foreign Application Priority Data

Nov. 4, 2016  (TW) .............................. 105135939 A

(51) Int. Cl.
| | |
|---|---|
| *G02B 5/28* | (2006.01) |
| *C23C 20/00* | (2006.01) |
| *C23C 14/06* | (2006.01) |
| *G02B 1/14* | (2015.01) |

(52) U.S. Cl.
CPC ............... *G02B 5/285* (2013.01); *C23C 14/06* (2013.01); *C23C 20/00* (2013.01); *G02B 1/14* (2015.01)

(58) Field of Classification Search
CPC .......... G02B 1/14; G02B 5/282; G02B 1/116; C09D 5/006; C23C 14/06; C23C 14/32; C23C 14/34; C23C 28/00

USPC .............. 75/236; 419/14; 420/580; 359/360, 359/585, 586

See application file for complete search history.

(56) References Cited

U.S. PATENT DOCUMENTS

| | | | | |
|---|---|---|---|---|
| 8,075,661 | B2 * | 12/2011 | Chen ....................... | C22C 1/051 419/14 |
| 2018/0022929 | A1 * | 1/2018 | Blush ..................... | C09D 5/006 |

\* cited by examiner

*Primary Examiner* — Audrey Y Chang

(57) ABSTRACT

In the present invention, a multi-film structure being coated on the surface of a workpiece is disclosed. The multi-film structure is formed by making a high-entropy material film of at least two layers and a non-high-entropy material film of at least one layer be stacked on each other. In addition, the multi-film structure can also be formed by making a first high-entropy material film of at least one layer and a second non-high-entropy material film of at least one layer be stacked on each other. This multi-film structure particularly contains interlaminar interfaces to inhibit crack extension and reduce plastic deformation, so that the hardness and toughness of the workpiece coated with this inventive multi-film structure would be obviously enhanced. Moreover, the appearance color of the workpiece can also be changed by the multi-film structure, wherein the color type is dependent on the optical interferences occurring in the multi-film structure.

9 Claims, 12 Drawing Sheets

1A

MULTI-FILM STRUCTURE

BACKGROUND OF THE INVENTION

1. Field of the Invention

The present invention relates to the technology field of surface modification, and more particularly to a multi-film structure capable of being coated onto the surface of a workpiece for modifying the physical and mechanical properties thereof.

2. Description of the Prior Art

Surface modification, such as mechanical surface treatment, chemical vapor deposition (CVD), vacuum evaporation deposition, sputter deposition, arc vapor deposition, or ion plating, is an act for modifying the surface of a material with improved physical, chemical or mechanical performance like corrosion resistance, hardness, and wear resistance.

For instance, hard films made of TiN, TiC, TiCN, or $Al_2O_3$ have been applied as surface coatings of various cutting tools for extending their service life. On the other hand, since metal coatings made of Cr, Ti, Al, Ti, or combinations of aforesaid two or more elements show glossy appearance and possess features of high corrosion resistance, good conductivity, and electromagnetic shielding ability, they have been employed as decorative or functional surface coatings. Currently, developed and industrialized countries have regarded the research and development (R&D) of surface modification technology as key topics.

However, owing to advances in science and technologies, parts or components used by industries of mechanical engineering, mold manufacturing, automotive, aerospace, and nuclear power are demanded with high quality and multi functions. As a result, traditional single-layer coatings cannot satisfy the demands on high wear and corrosion resistances in some high-technology industries. On the other hand, traditional single-layer coatings merely express those typical colors such as silver, silvery-gray, black, blue-gray, black-purple, bronze, pale gold, and golden yellow. It is impossible for traditional single-layer coatings to obtain other colors. In view of the above limitation, multi-layer coatings formed by a variety of film materials stacked onto each other are hence developed and proposed, wherein the film materials for forming the multi-layer coatings are mainly classified to alloy films and compound films. The compound films include nitride film, carbide film, carbonitride film, and oxide film. Particularly, because the multi-layer coatings contain interlayer interfaces for inhibiting crack extension and reducing plastic deformation, they could exhibit outstanding hardness and toughness compared to the traditional single-layer coatings. Moreover, the multi-layer coatings can also reveal different color appearances through the optical interferences between layers.

Even though the multi-layer coatings have outstanding features of high hardness and excellent toughness, design schemes of material compositions for constructing the multi-layer coatings are still subject to limitations. For example, U.S. patent publication No. 2013/244054 disclosed a surface coating of Zr-based metallic glass, wherein the elemental composition of the Zr-based metallic glass is $Zr_{50}Cu_{27}Al_{16}Ni_7$. Apparently, this surface coating of Zr-based metallic glass is based on one major component zirconium. On the other hand, typical compound films including TiC, TiCN, (Ti, Al)N, TiAlCN, (Ti, Zr)N, (Ti, Al, V)N, (Ti, Nb)N, (Ti, Al, Zr)N, and $Al_2O_3$, are synthetized by carrying out the reaction between 1-3 kinds of metal or metalloid elements and at least one non-metallic element like C, B, N, and/or O during deposition.

Accordingly, in order to enhance the physical, chemical and mechanical performance, and service life of the multi-layer coatings, inventors of the present application have made great efforts to make inventive research thereon and eventually provided a multi-film structure.

SUMMARY OF THE INVENTION

Since all of materials used to fabricate conventional multi-layer coatings are not high-entropy materials, designs schemes of material compositions for constructing the multi-layer coatings are hence limited. So that, the primary objective of the present invention is to provide a multi-film structure formed by making at least two high-entropy material films and other non-high-entropy material films being stacked onto each other. In addition, the multi-film structure can also be formed by making at least two high-entropy material films being stacked onto each other. It is worth explaining that, this multi-film structure particularly contains interlaminar interfaces to inhibit crack propagation and reduce plastic deformation, so that the hardness and toughness of the workpiece coated with this multi-film structure would be obviously enhanced. Moreover, the appearance color of the workpiece can also be changed or improved by tuning the multi-film structure, wherein the colour is dependent on the optical interferences occurring in the multi-film structure.

In order to achieve the primary objective of the present invention, the inventor of the present invention provides one embodiment for the multi-film structure capable of being coated on the surface of a workpiece. In this embodiment, the multi-film structure is formed by making a high-entropy material film of at least two layers and a non-high-entropy material film of at least one layer be stacked onto each other; moreover, the multi-film structure exhibits a total nano-indentation hardness of at least 10 GPa.

In the aforesaid embodiment for the multi-film structure, the non-high-entropy material film can be a non-high-entropy pure metal film, a non-high-entropy alloy film, a non-high-entropy nitride film, a non-high-entropy carbide film, a non-high-entropy boride film, a non-high-entropy diamond-like carbon film, a non-high-entropy nitroxide film, a non-high-entropy carbonitride film, a non-high-entropy oxide film, a non-high-entropy carboxide film, or other non-high-entropy ceramic film.

Moreover, in the aforesaid embodiment for the multi-film structure, the high-entropy material film can be a high-entropy alloy film, a high-entropy nitride film, a high-entropy carbide film, a high-entropy nitroxide film, a high-entropy carbonitride film, a high-entropy oxide film, a high-entropy carboxide film, or other high-entropy ceramic film.

Furthermore, to achieve the primary objective of the present invention, the inventor of the present invention provides another one embodiment for the multi-film structure capable of being coated on the surface of a workpiece. In this embodiment, the multi-film structure is formed by making one layer of a first high-entropy material film and one layer of a second high-entropy material film be stacked onto each other; moreover, the multi-film structure has a layer number of at least two layers and exhibits a total nano-indentation hardness of at least 10 GPa.

Moreover, in the aforesaid embodiment for the multi-film structure, both the first high-entropy material film and the second high-entropy material film can be a high-entropy alloy film, a high-entropy nitride film, a high-entropy carbide film, a high-entropy nitroxide film, a high-entropy carbonitride film, a high-entropy oxide film, a high-entropy carboxide film, and other high-entropy ceramic film.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

Figure 1:
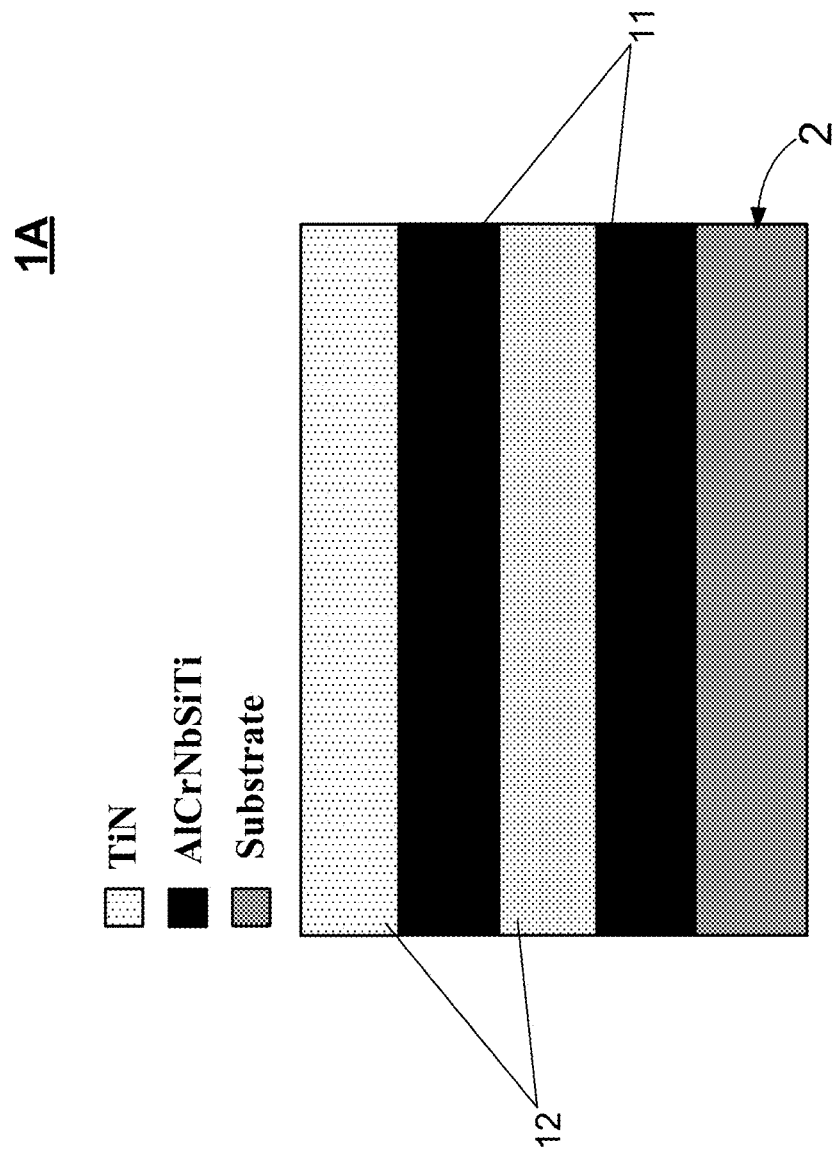
FIG. 1 shows a cross-sectional view of sample No. 1 of a multi-film structure according to the present invention.

To more clearly describe a multi-film structure according to the present invention, embodiments of the present invention will be described in detail with reference to the attached drawings hereinafter.

Differing from traditional alloys containing one principal metal element, a new design concept of high-entropy alloys (HEAs) has been disclosed by literature 1. Literature 1, written by Yeh et. al, is entitled with "Nanostructured High-entropy Alloys with Multi-Principal Elements—Novel Alloy Design Concepts and Outcomes" and published on ADVANCED ENGINEERING MATERIALS 6(5)(2004), pp. 299-303). Particularly, Yeh et. al defined that a high-entropy alloy must contain at least five principal elements with the concentration of each element being between 35 and 5 at %. According to the definition of HEAs described in literature 1, there are countless compositions for synthesizing HEAs. For instance, there is 1716 combinations of element from 5 elements to 13 elements for constructing 1716 HEA systems when 13 elements are chosen. In each alloy system, different compositions with concentrations in equiatomic or non-equiatomic ratio could be designed for synthesizing HEAs of the HEA system.

One the other hand, literature 2 has reported that a high-entropy ceramics means a high-entropy nitride, a high-entropy carbide, a high-entropy nitroxide, a high-entropy carbonitride, a high-entropy oxide, a high-entropy carboxide, a high-entropy silicide, or a high-entropy boride synthetized by carrying out different reaction between the said HEA and at least one non-metallic element like N, C, O, B, and/or Si. Herein literature 2 is also written by Gao et. al, entitled with "High-entropy alloys—fundamentals and applications", and published by SPRINGER INTERNATIONAL PUBLISHING SWITZERLAND (2016, pp. 469-491). So, engineers skilled in technology field of alloy developing and manufacturing can easily know that the said high-entropy materials include high-entropy alloys and high-entropy ceramics. Moreover, literature 2 further reported that the high-entropy alloys (HEAs) can also have a new definition based on configurational entropy. According to the HEA definition disclosed by literature 2, an alloy is classified to HEAs as the configurational entropy of the alloy is greater than 1.5 R, wherein R is a gas constant. In addition, when alloy's configurational entropy is close to 1.5 R, the alloy is still regarded as a high-entropy alloy in the broad sense. Apparently, the definition scope of HEAs introduced by literatures 1 or 2 is broader than that introduced only by literatures 1 or only by literature 2.

Therefore, the primary technology feature of the present invention is to make a first high-entropy material film of at least two layers and a non-high-entropy material film of at least one layer, or a first high-entropy materials of at least one layer and a second high-entropy material film of at least one layer be stacked onto each other, so as to form a performance-improved multi-film structure capable of being coated on the surface of a workpiece.

First Embodiment

In the first embodiment, the multi-film structure is formed by making a high-entropy material film of at least two layers and a non-high-entropy material film of at least one layer be alternately stacked onto each other, wherein the multi-film structure exhibits a total nano-indentation hardness of at least 10 GPa. It is worth explaining that, both the high-entropy material film and the non-high-entropy material film are formed by a process technology of physical vapor deposition (PVD) like sputter deposition, arc vapor deposition, and ion plating.

Moreover, for fabricating the multi-film structure, the said non-high-entropy material film can be a non-high-entropy pure metal film, a non-high-entropy alloy film, a non-high-entropy nitride film, a non-high-entropy carbide film, a non-high-entropy boride film, a non-high-entropy diamond-like carbon film, a non-high-entropy nitroxide film, a non-high-entropy carbonitride film, a non-high-entropy oxide film, a non-high-entropy carboxide film, or other non-high-entropy ceramic film. On the other hand, the said high-entropy material film can be a high-entropy alloy film, a high-entropy nitride film, a high-entropy carbide film, a high-entropy nitroxide film, a high-entropy carbonitride film, a high-entropy oxide film, a high-entropy carboxide film, and other high-entropy ceramic film.

Practicability Verification of First Embodiment

In order to prove the practicability of the proposed first embodiment for the multi-film structure, inventors of the present invention have completed the fabrication of several samples of the multi-film structure. Please refer to FIG. 1, which illustrates a cross-sectional view of sample No. 1 of the multi-film structure. As FIG. 1 shows, the sample No. 1

(1A) of the multi-film structure is coated on the surface of a workpiece 2, wherein the sample No. 1 (1A) is formed by making two high-entropy material films and two non-high-entropy material films be alternately stacked onto each other. In the sample No. 1 (1A), the said high-entropy material film is a high-entropy alloy film 11 having the equiatomic composition of AlCrNbSiTi and the thickness of 0.25 μm. On the other hand, the said non-high-entropy material film is a binary nitride film 12 having the composition of TiN and the thickness of 0.25 μm. It is worth noting that, in order to let the sample No. 1 (1A) contain two high-entropy material films, the layer number of the sample No. 1 (1A) is designed to 4. That is, the sample No. 1 (1A) contain two high-entropy material films as well as two non-high-entropy material films be alternately stacked onto each other. Moreover, physical features and mechanical properties of the sample No. 1 (1A) have been measured and recorded in following Table (1).

TABLE 1

| Samples | Physical features | Mechanical properties |
| --- | --- | --- |
| No. 1 | bright golden yellow appearance | (1) total nano-indentation hardness: 18 GPa<br>(2) possessing impact resistance |
| No. 2 | bright gray-gold appearance | (1) total nano-indentation hardness: 30 GPa<br>(2) possessing high crack-resistant toughness and wear resistance |
| No. 3 | bright silver-gray appearance | (1) total nano-indentation hardness: 33 GPa<br>(2) possessing high crack-resistant toughness, low friction coefficient and high wear resistance |
| No. 4 | bright light blue-green appearance | (1) total nano-indentation hardness: 18 GPa<br>(2) possessing high toughness, impact resistance and wear resistance |
| No. 5 | bright silver appearance | (1) total nano-indentation hardness: 23 GPa<br>(2) possessing high crack-resistant toughness, impact resistance and wear resistance as well as low friction coefficient |
| No. 6 | bright silver-gray appearance | (1) total nano-indentation hardness: 32 GPa<br>(2) possessing high crack-resistant toughness, impact resistance, and wear resistance as well as low friction coefficient |
| No. 7 | bright silver appearance | (1) total nano-indentation hardness: 32 GPa<br>(2) possessing high crack-resistant toughness, impact resistance and wear resistance as well as low friction coefficient |

Figure 2:
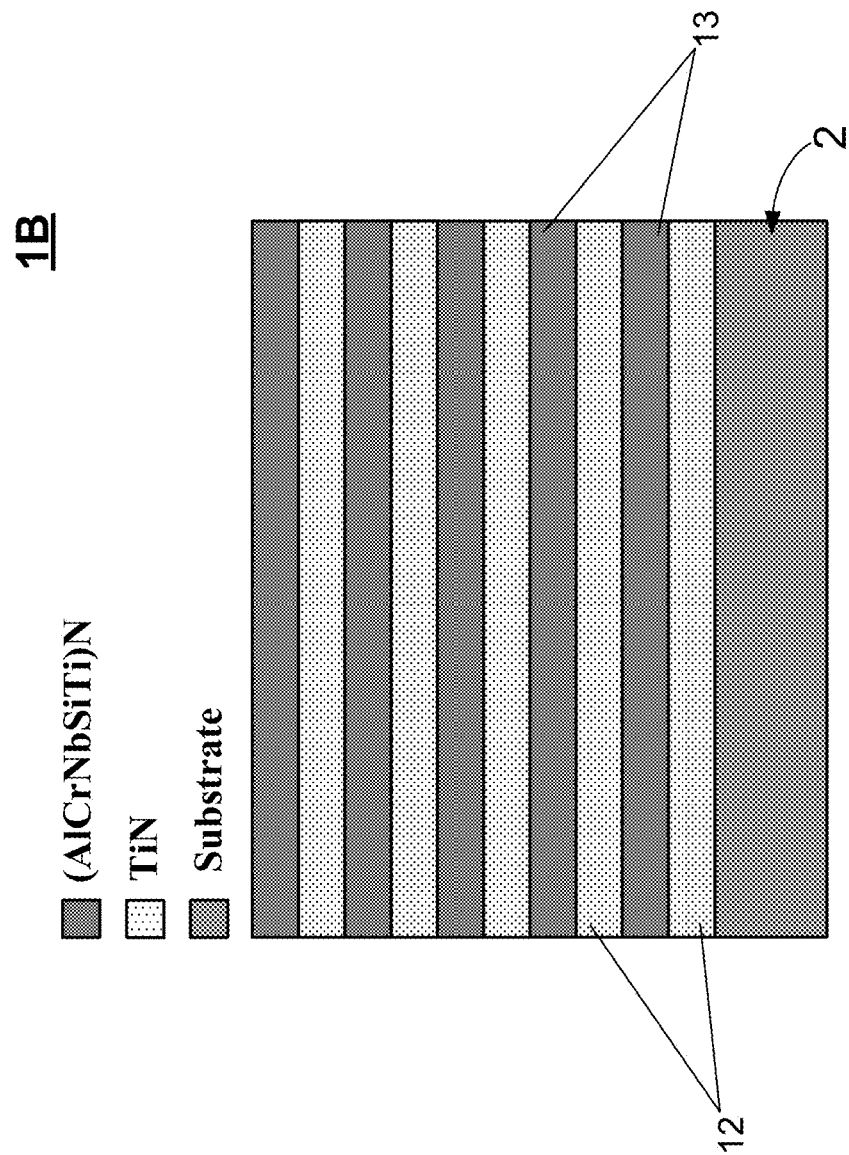
FIG. 2 shows a cross-sectional view of sample No. 2 of the multi-film structure.

Continuously, please refer to FIG. 2, which illustrates a cross-sectional view of sample No. 2 of the multi-film structure. In the sample No. 2 (1B), the said high-entropy material film is a high-entropy nitride film 13 having the composition of (AlCrNbSiTi)N, i.e. $(Al_{10}Cr_{10}Nb_{10}Si_{10}Ti_{10})N_{50}$ and the thickness of 0.2 μm. On the other hand, the said non-high-entropy material film is also the binary nitride film 12 having the composition of TiN and the thickness of 0.2 μm. As FIG. 2 shows, the layer number of the sample No. 2 (1B) is 10. That means the sample No. 2 (1B) contains the high-entropy material films of 5 layers. Moreover, physical features and mechanical properties of the sample No. 2 (1B) have been measured and recorded in above-presented Table (1).

Figure 3:
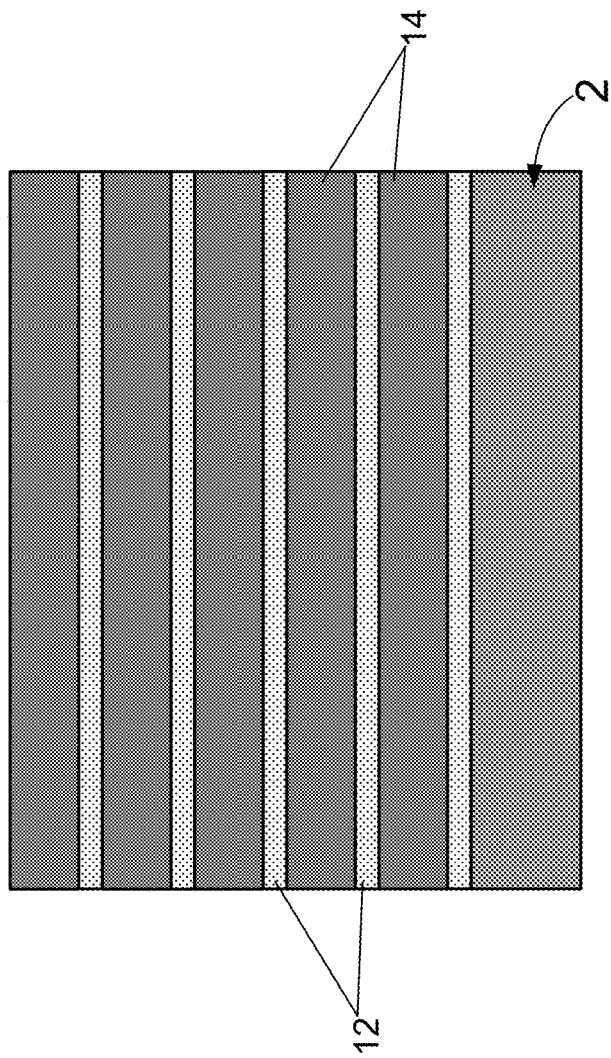
FIG. 3 shows a cross-sectional view of sample No. 3 of the multi-film structure.

Please subsequently refer to FIG. 3, where a cross-sectional view of sample No. 3 of the multi-film structure is provided. In the sample No. 3 (1C), the said high-entropy material film is a high-entropy carbide film 14 having the composition of (AlCrHfNbSiTi)C and the thickness of 0.3 μm. On the other hand, the said non-high-entropy material film is a binary nitride film 12 having the composition of ZrN and the thickness of 0.1 μm. As FIG. 3 shows, the layer number of the sample No. 3 (1C) is 10. That means the sample No. 3 (1C) contains 5-layer high-entropy material films. It is worth explaining that, since the binary nitride film 12 shown in FIG. 2 is TiN and the composition of the binary nitride film 12 shown in FIG. 3 is ZrN, the pattern shown in FIG. 2 for expressing TiN is different from the pattern shown in FIG. 3 for expressing ZrN. In addition, physical features and mechanical properties of the sample No. 3 (1C) have been measured and recorded in above-presented Table (1).

Figure 4:
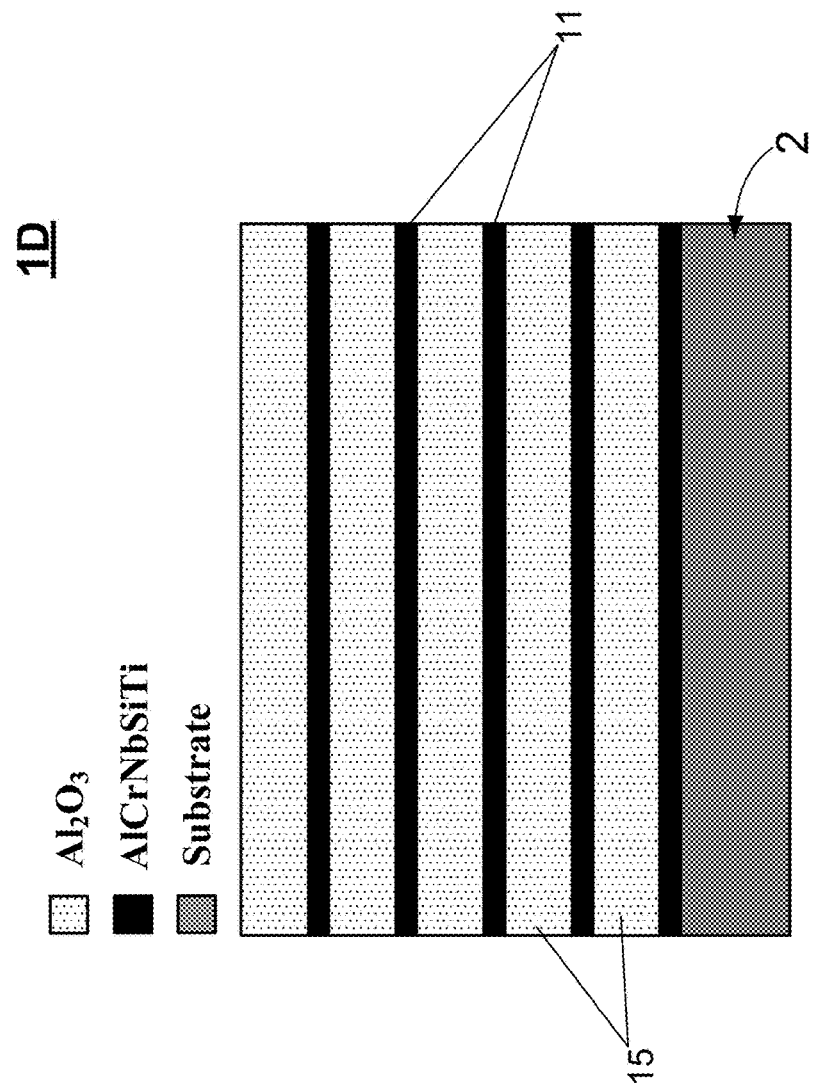
FIG. 4 shows a cross-sectional view of sample No. 4 of the multi-film structure.

Moreover, from the cross-sectional view of sample No. 4 of the multi-film structure shown by FIG. 4, it is able to know that the said high-entropy material film adopted for forming the sample No. 4 (1D) is also the high-entropy alloy film 11 having the equiatomic composition of AlCrNbSiTi and the thickness of 0.1 μm. On the other hand, the said non-high-entropy material film is a binary oxide film 15 having the composition of $Al_2O_3$ and the thickness of 0.3 μm. As FIG. 4 shows, the layer number of the sample No. 4 (1D) is 10. The physical features and mechanical features of the sample No. 4 (1D) are also listed in above-presented Table (1).

Figure 5:
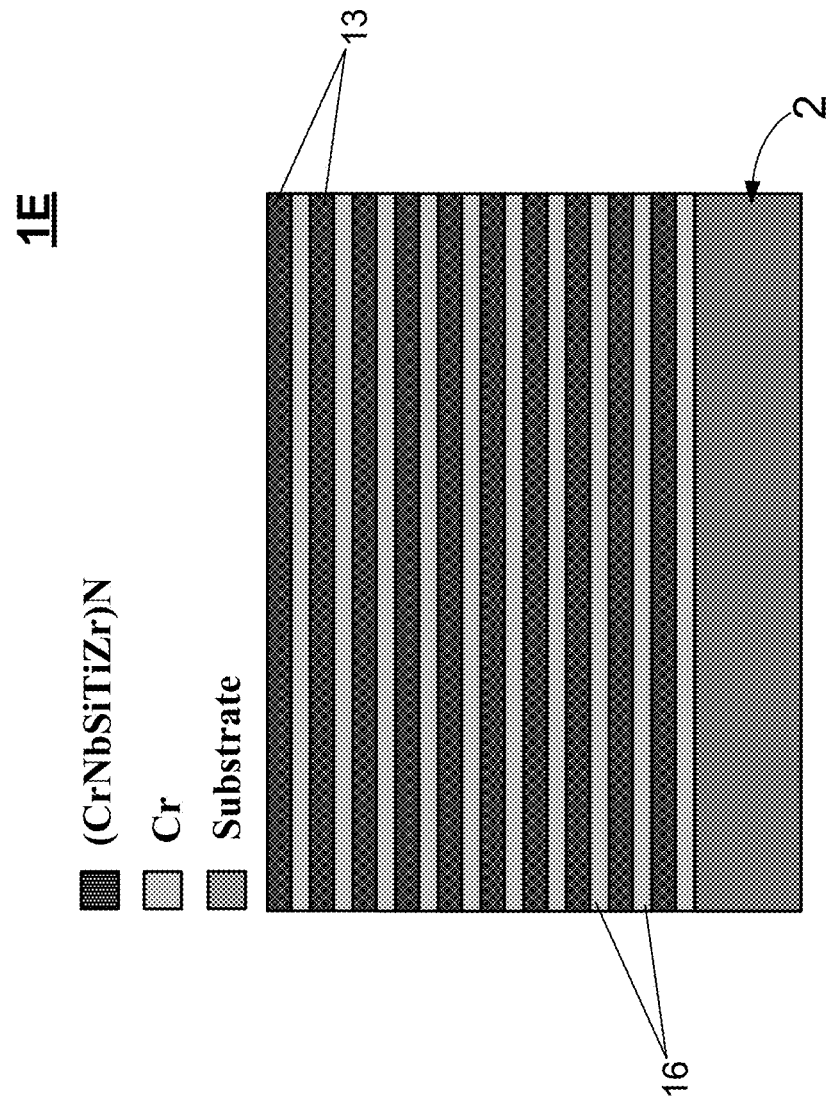
FIG. 5 shows a cross-sectional view of sample No. 5 of the multi-film structure.

Please continuously refer to FIG. 5, which illustrates a cross-sectional view of sample No. 5 of the multi-film structure. In the sample No. 5 (1E), the said high-entropy material film is also the high-entropy nitride film 13 having the composition of (CrNbSiTiZr)N and the thickness of 0.15 μm. On the other hand, the said non-high-entropy material film is a metal film 16 made of Cr having the thickness of 0.1 μm. As FIG. 5 shows, the layer number of the sample No. 5 is 20. That means the sample No. 5 (1E) contain the high-entropy material films of 10 layers. It is worth explaining that, since the high-entropy nitride film 13 shown in FIG. 2 is (AlCrNbSiTi)N and the composition of the high-entropy nitride film 13 shown in FIG. 5 is (CrNbSiTiZr)N, the pattern shown in FIG. 2 for expressing (AlCrNbSiTi)N is different from the pattern shown in FIG. 5 for expressing (CrNbSiTiZr)N. Moreover, the physical features and mechanical properties of the sample No. 5 (1E) have been measured and recorded in above-presented Table (1).

Figure 6:
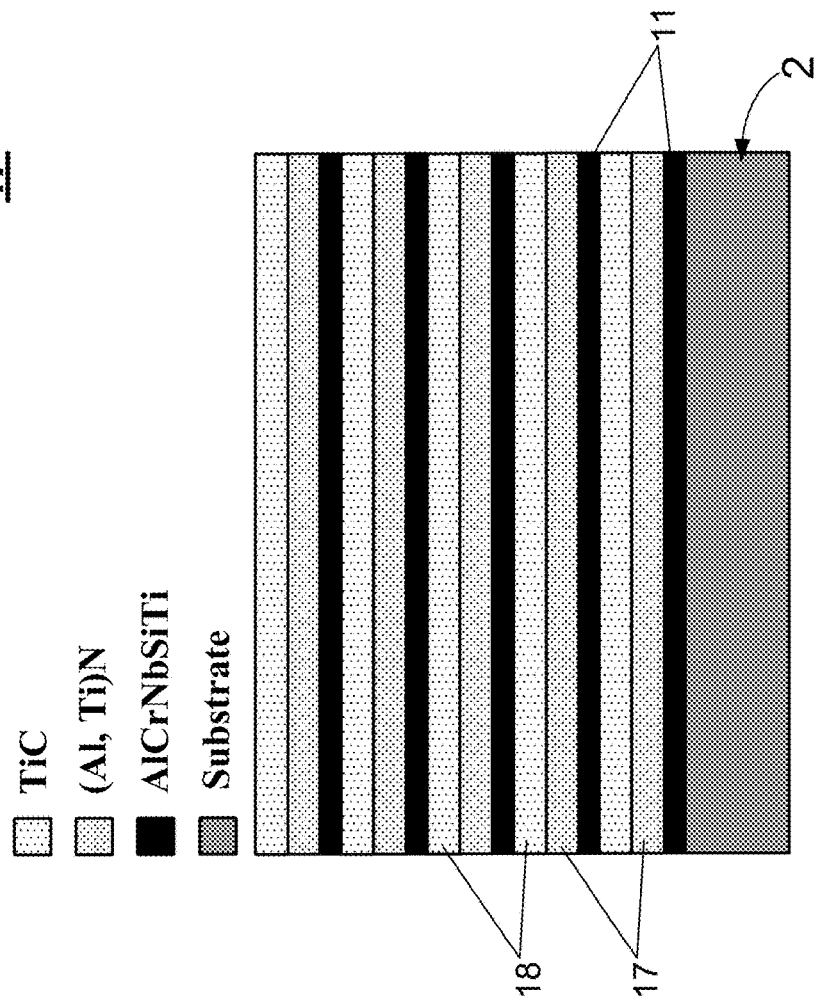
FIG. 6 shows a cross-sectional view of sample No. 6 of the multi-film structure.

From a cross-sectional view of sample No. 6 of the multi-film structure shown by FIG. 6, it is able to know that the said high-entropy material film is also the high-entropy alloy film 11 having the equiatomic composition of AlCrNbSiTi and the thickness of 0.1 μm. It is worth noting that, sample No. 6 contains two kinds of non-high-entropy material films. One the two non-high-entropy material films is a binary carbide film 18 having the composition of TiC and the thickness of 0.2 μm, and the other one is a ternary nitride film 17 having the composition of (Al,Ti)N and the thickness of 0.2 μm. As FIG. 6 shows, the layer number of the sample No. 6 (1F) is 15, and the physical features and mechanical characteristics of the sample No. 6 (1F) have been measured and recorded in above-presented Table (1).

Figure 7:
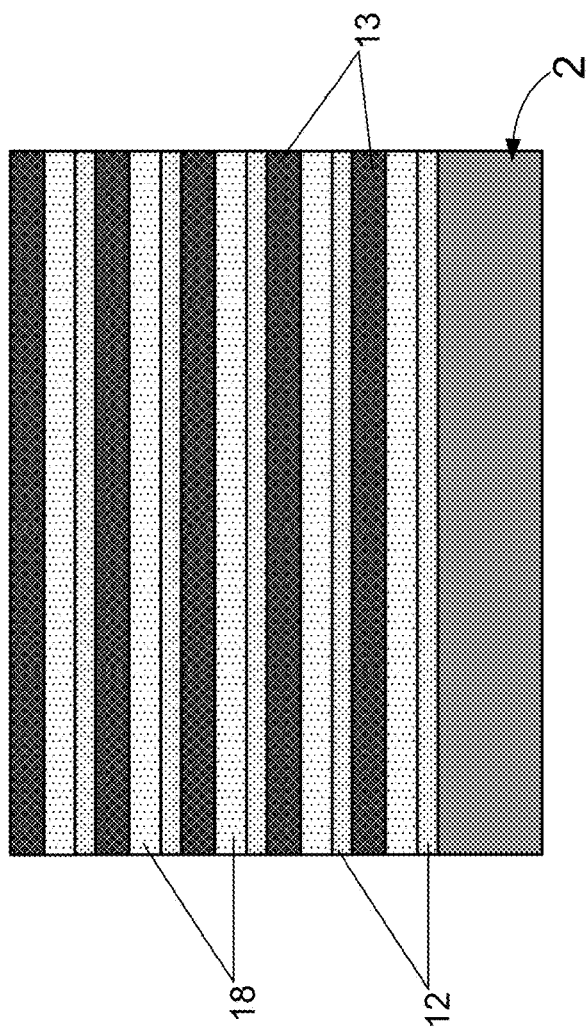
FIG. 7 shows a cross-sectional view of sample No. 7 of the multi-film structure.

Furthermore, from the cross-sectional view of sample No. 7 of the multi-film structure shown by FIG. 7, it is able to know that the sample No. 7 (1G) is formed by making 5-layer binary nitride film 12, 5-layer binary carbide film 18, and 5-layer high-entropy nitride film 13 be stacked onto each other. In the sample No. 7 (1G), the binary nitride film 12 has the composition of TiN and the thickness of 0.1 μm, the binary carbide film 18 has the composition of TiC and the thickness of 0.2 μm, and the high-entropy nitride film 13 has the composition of (CrNbSiTiZr)N and the thickness of 0.2 μm. As FIG. 7 shows, the layer number of the sample No.

7 (1G) is 15, and the physical features and mechanical properties of the sample No. 7 (1G) are also listed in above-presented Table (1).

Therefore, the above descriptions have proved the practicability of the multi-film structure proposed by the present invention through the exhibition of a variety of experimental data. In following paragraphs, a second embodiment for the multi-film structure will be subsequently introduced.

Second Embodiment

In the second embodiment, the multi-film structure is formed by making a first high-entropy material film of at least one layer and a second high-entropy material film of at least one layer be alternately stacked onto each other, wherein the multi-film structure has a layer number of at least two layers and exhibits a total nano-indentation hardness of at least 10 GPa. According to the reports of above-mentioned literatures 1 and 2, high-entropy materials includes high-entropy alloys and high-entropy ceramics. So that, based on literatures 1, the engineers skilled in technology field of alloy developing and manufacturing can easily design a composition and synthesize the said high-entropy alloy film. On the other hand, based on literatures 2, the engineers can also design a composition and synthesize the said high-entropy ceramic film. Therefore, it is able to understand that, the experimental samples of the multi-film structure presented in the specification of the present invention are just the exemplary embodiments, which does not used for limiting the practical embodiments of the multi-film structure.

Practicability Verification of Second Embodiment

Figure 8:
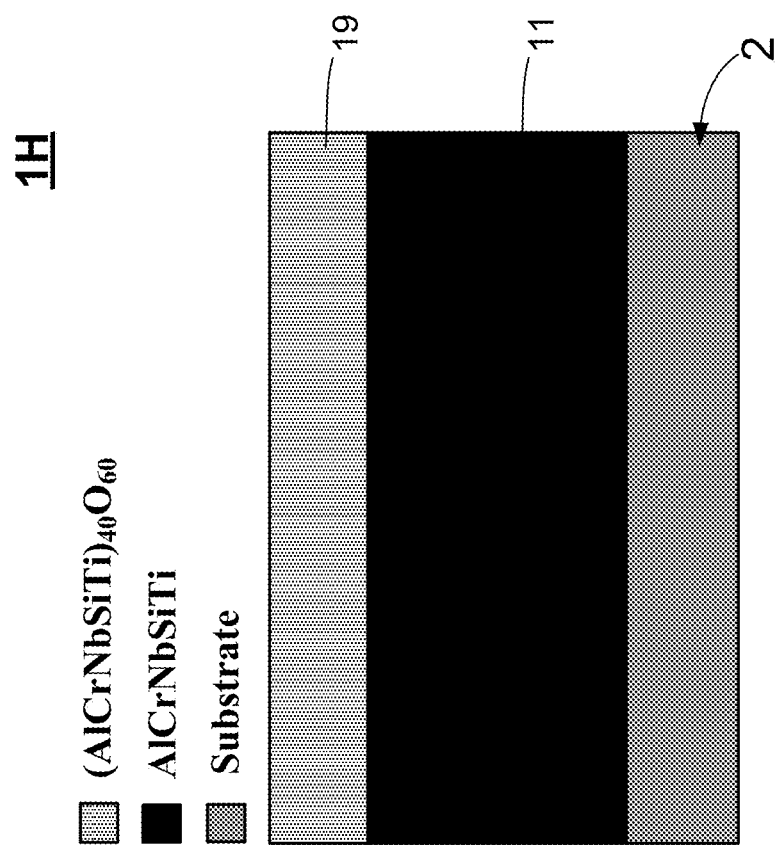
FIG. 8 shows a cross-sectional view of sample No. 8 of the multi-film structure.

For proving the practicability of the proposed second embodiment for the multi-film structure, inventors of the present invention has completed the fabrication of several samples of the multi-film structure. Please refer to FIG. 8, which illustrates a cross-sectional view of sample No. 8 of the multi-film structure. As FIG. 8 shows, the sample No. 8 (1H) of the multi-film structure is coated on the surface of a workpiece 2, wherein the sample No. 8 (1H) is formed by stacking a high-entropy oxide film 19 (i.e., the second high-entropy material film) onto a high-entropy alloy film 11 (i.e., the first high-entropy material film). In the sample No. 8 (1h), the high-entropy alloy film 11 has the composition of AlCrNbSiTi and the thickness of 0.8 μm, and the high-entropy oxide film 19 has the composition of (AlCrNbSiTi)$_{40}$O$_{60}$ and the thickness of 0.2 μm. It is worth noting that, in spite of the layer number of the sample No. 8 (1H) is merely 2, the sample No. 8 (1H) has contained two high-entropy material films. Moreover, physical features and mechanical properties of the sample No. 8 (1H) have been measured and recorded in following Table (2).

TABLE 2

| Samples | Physical features | Mechanical properties |
| --- | --- | --- |
| No. 8 | bright purple appearance | (1) total nano-indentation hardness: 12 GPa |
| No. 9 | bright gray-purple appearance | (1) total nano-indentation hardness: 17 GPa (2) possessing low friction coefficient |
| No. 10 | bright light blue appearance | (1) total nano-indentation hardness: 20 GPa (2) possessing high crack-resistant toughness, impact resistance and wear resistance |

TABLE 2-continued

| Samples | Physical features | Mechanical properties |
| --- | --- | --- |
| No. 11 | bright light pink appearance | (1) total nano-indentation hardness: 16 GPa (2) possessing high crack-resistant toughness, impact resistance and wear resistance as well as low friction coefficient |
| No. 12 | bright silver-gray appearance | (1) total nano-indentation hardness: 30 GPa (2) possessing high crack-resisitant toughness, impact resistance and wear resistance as well as low friction coefficient |

Figure 9:
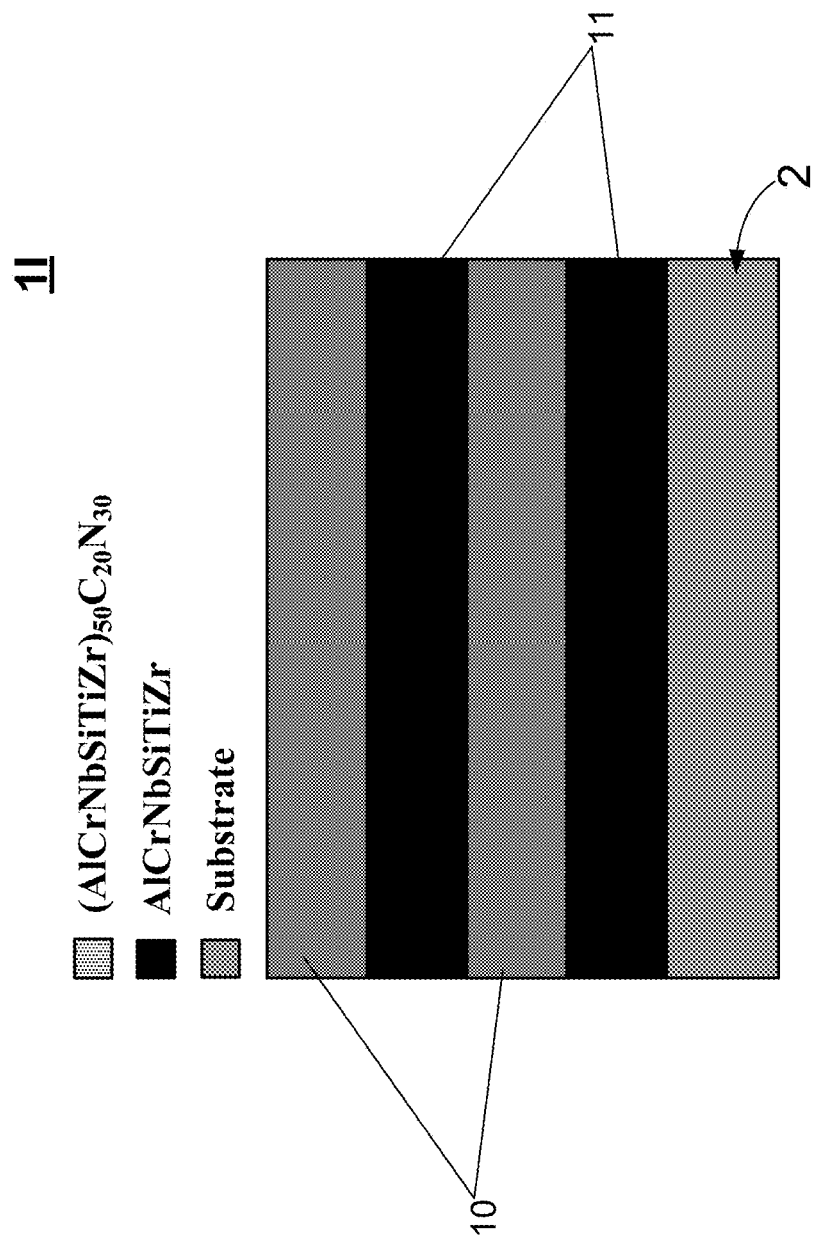
FIG. 9 shows a cross-sectional view of sample No. 9 of the multi-film structure.

Please continuously refer to FIG. 9, which illustrates a cross-sectional view of sample No. 9 of the multi-film structure. In the sample No. 9 (1I), the said first high-entropy material film is also the high-entropy alloy film 11 having the composition of AlCrNbSiTiZr and the thickness of 0.4 μm. On the other hand, the said second high-entropy material film is a high-entropy carbonitride film 10 having the composition of (AlCrNbSiTiZr)$_{50}$C$_{20}$N$_{30}$ and the thickness of 0.4 μm. As FIG. 9 shows, the layer number of the sample No. 9 (1I) is 4, and the physical features and mechanical properties of the sample No. 9 (1I) have been measured and recorded in above-presented Table (2).

Figure 10:
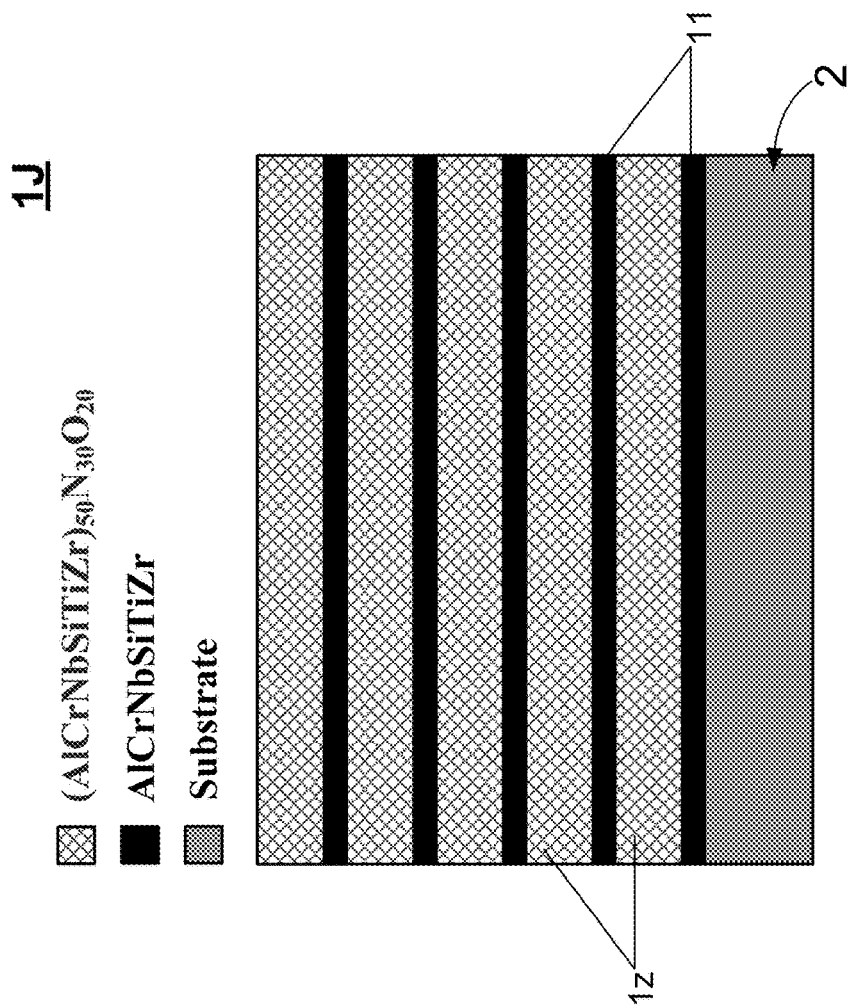
FIG. 10 shows a cross-sectional view of sample No. 10 of the multi-film structure.

Next, please refer to FIG. 10, where a cross-sectional view of sample No. 10 of the multi-film structure is provided. In the sample No. 10 (1J), the said first high-entropy material film is also the high-entropy alloy film 11 having the composition of AlCrNbSiTiZr and the thickness of 0.1 μm. On the other hand, the said second high-entropy material film is a high-entropy nitrogen oxide film 1z having the composition of (AlCrNbSiTiZr)$_{50}$N$_{30}$O$_{20}$ and the thickness of 0.3 μm. As FIG. 10 shows, the layer number of the sample No. 10 (1J) is 10, and the physical features and mechanical properties of the sample No. 10 (1J) have been measured and recorded in above-presented Table (2).

Figure 11:
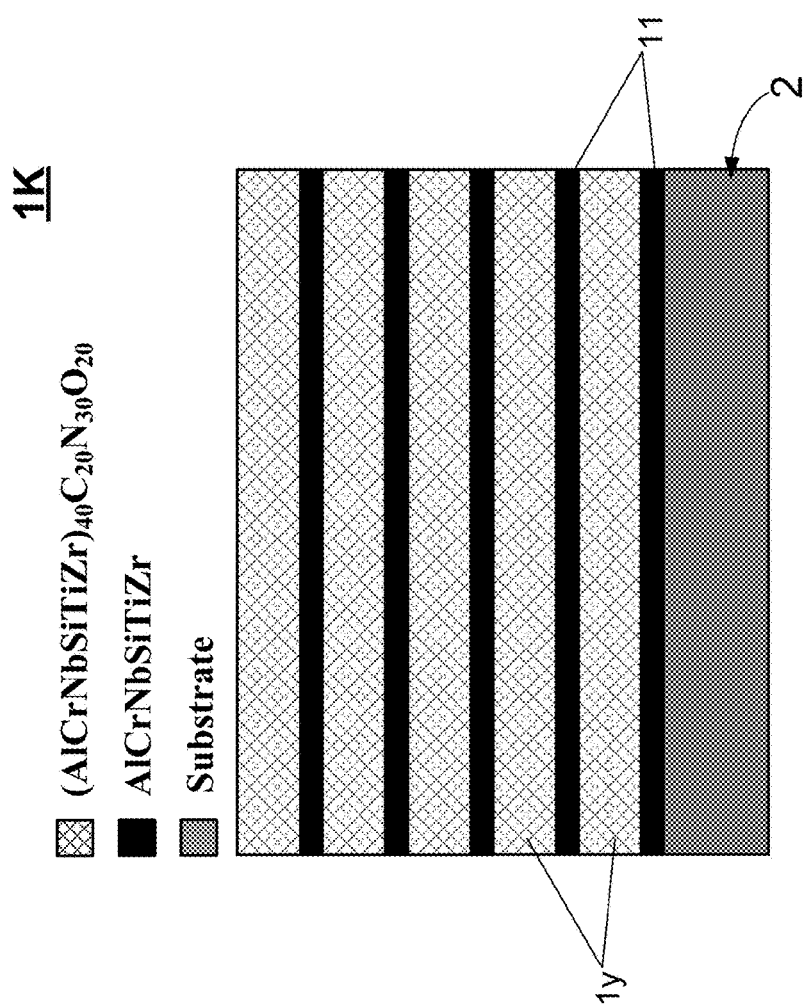
FIG. 11 shows a cross-sectional view of sample No. 11 of the multi-film structure.

Moreover, from the cross-sectional view of sample No. 11 of the multi-film structure shown by FIG. 11, it is able to know that the said first high-entropy material film adopted for forming the sample No. 11 (1S) is also the high-entropy alloy film 11 having the composition of AlCrNbSiTiZr and the thickness of 0.2 μm. On the other hand, the said second high-entropy material film is a high-entropy carbon oxynitride film 1y having the composition of (AlCrNbSiTiZr)$_{40}$C$_{20}$N$_{30}$O$_{20}$ and the thickness of 0.6 μm. As FIG. 11 shows, the layer number of the sample No. 11 (1K) is 10, and the physical features and mechanical properties of the sample No. 11 (1K) are also listed in above-presented Table (2).

Figure 12:
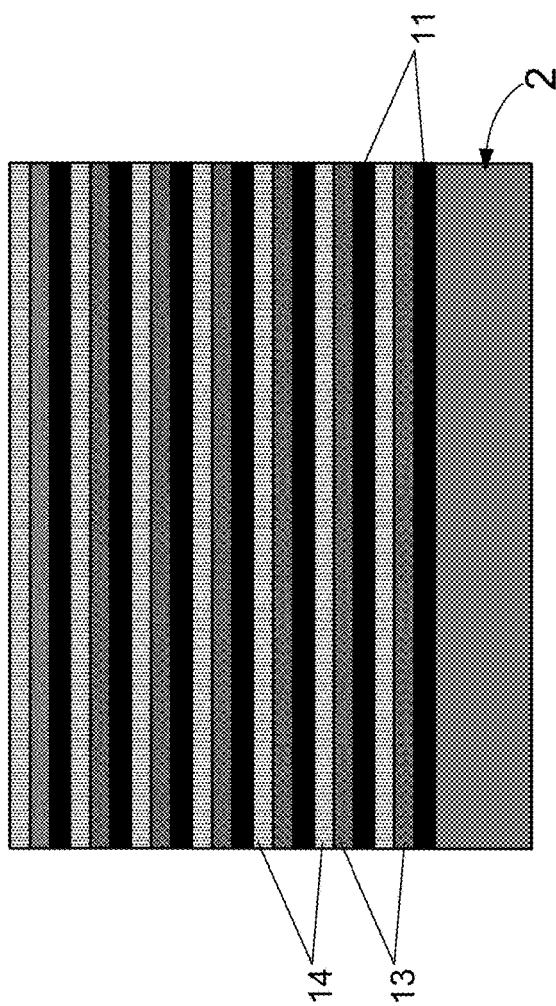
FIG. 12 shows a cross-sectional view of sample No. 12 of the multi-film structure.

Furthermore, from the cross-sectional view of sample No. 12 of the multi-film structure shown by FIG. 12, it is able to know that the sample No. 12 (1L) is formed by making a high-entropy alloy film 11 of 7 layers, a high-entropy nitride film 13 of 7 layers, and a high-entropy carbide film 14 of 7 layers be alternatively stacked onto each other. In the sample No. 12 (1L), the high-entropy alloy film 11 has the composition of AlCrNbSiTiZr and the thickness of 0.1 μm, the high-entropy nitride film 13 has the composition of (AlCrNbSiTiZr)N and the thickness of 0.2 μm, and the high-entropy carbide film 14 has the composition of (CrNbSiTiZr)C and the thickness of 0.2 μm. As FIG. 12 shows, the layer number of the sample No. 12 (1L) is 21, and the physical features and mechanical properties of the sample No. 12 (1L) are also listed in above-presented Table (2).

Therefore, through above descriptions, the multi-film structure provided by the present invention has been introduced completely and clearly; in summary, the present invention includes the advantages of:

(1) Since all of materials used to fabricate conventional multi-layer coatings are not high-entropy materials, designs schemes of material compositions for constructing the multi-layer coatings are hence limited. So that, the primary objective of the present invention is to provide a multi-film structure formed by making at least two high-entropy material films and other non-high-entropy material films be stacked onto each other. In addition, the multi-film structure can also be formed by making a first high-entropy materials of at least one layer and a second high-entropy material film of at least one layer be stacked onto each other. It is worth explaining that, this multi-film structure particularly contains interlaminar interfaces to inhibit crack extension and reduce plastic deformation, so that the hardness and toughness of the workpiece coated with this multi-film structure would be obviously enhanced. Moreover, the appearance color of the workpiece can also be changed by the multi-film structure, wherein the color type is dependent on the optical interferences occurring in the multi-film structure.

(2) Moreover, because the high-entropy materials could possess high mechanical strength, thermal stability, anti-oxidation ability, and corrosion resistance, it is able to improve the properties and functionalities of the multi-film structure by properly changing the formula of material compositions, so as to facilitate the multi-film structure be able to satisfy the demands from certain high-technology industries.

The above description is made on embodiments of the present invention. However, the embodiments are not intended to limit the scope of the present invention, and all equivalent implementations or alterations within the spirit of the present invention still fall within the scope of the present invention.

What is claimed is:

1. A multi-film structure being coated on the surface of a workpiece and being formed by making a high-entropy material film of at least two layers and a non-high-entropy material film of at least one layer be periodically stacked onto each other; wherein the multi-film structure exhibits a total nano-indentation hardness of at least 10 GPa.

2. The multi-film structure of claim 1, wherein the non-high-entropy material film is selected from the group consisting of: non-high-entropy pure metal film, non-high-entropy alloy film, non-high-entropy nitride film, non-high-entropy carbide film, non-high-entropy boride film, non-high-entropy diamond-like carbon film, non-high-entropy nitroxide film, non-high-entropy carbonitride film, non-high-entropy oxide film, non-high-entropy carboxide film, and other non-high-entropy ceramic films.

3. The multi-film structure of claim 1, wherein the high-entropy material film is selected from the group consisting of: high-entropy alloy film, high-entropy nitride film, high-entropy carbide film, high-entropy nitroxide film, high-entropy carbonitride film, high-entropy oxide film, high-entropy carbon oxide film, and other high-entropy ceramic films.

4. The multi-film structure of claim 1, wherein both the high-entropy material film and the non-high-entropy material film are formed by a process technology of physical vapor deposition (PVD).

5. The multi-film structure of claim 4, wherein the said physical vapor deposition is sputter deposition, arc vapor deposition, or ion plating.

6. A multi-film structure being coated on the surface of a workpiece and being formed by making a first high-entropy material film of at least one layer and a second high-entropy material film of at least one layer be periodically stacked onto each other; wherein the multi-film structure has a layer number of at least two layers and exhibits a total nano-indentation hardness of at least 10 GPa.

7. The multi-film structure of claim 6, wherein both the first high-entropy material film and the second high-entropy material film are selected from the group consisting of: high-entropy alloy film, high-entropy nitride film, high-entropy carbide film, high-entropy nitroxide film, high-entropy carbonitride film, high-entropy oxide film, high-entropy carboxide film, and other high-entropy ceramic films.

8. The multi-film structure of claim 6, wherein both the first high-entropy material film and the second high-entropy material film are formed by a process technology of physical vapor deposition (PVD).

9. The multi-film structure of claim 8, wherein the said physical vapor deposition is sputter deposition, arc vapor deposition, or ion plating.

* * * * *